United States Patent
Kong et al.

(10) Patent No.: US 12,230,514 B2
(45) Date of Patent: Feb. 18, 2025

(54) SUBSTRATE PROCESSING APPARATUS INCLUDING FILLING GAS SUPPLY LINE AND SUBSTRATE PROCESSING METHOD USING THE SAME

(71) Applicant: SAMSUNG ELECTRONICS CO., LTD., Suwon-si (KR)

(72) Inventors: Byunghwan Kong, Uiwang-si (KR); Heeyeon Kim, Seoul (KR); Homin Son, Seoul (KR); Geunkyu Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 585 days.

(21) Appl. No.: 17/499,988

(22) Filed: Oct. 13, 2021

(65) Prior Publication Data

US 2022/0285174 A1  Sep. 8, 2022

(30) Foreign Application Priority Data

Mar. 8, 2021  (KR) .......................... 10-2021-0030029

(51) Int. Cl.
*H01L 21/67*  (2006.01)

(52) U.S. Cl.
CPC .............................. *H01L 21/67011* (2013.01)

(58) Field of Classification Search
None
See application file for complete search history.

(56) References Cited

U.S. PATENT DOCUMENTS

| | | | |
|---|---|---|---|
| 9,394,607 B2 | 7/2016 | Nishida et al. | |
| 10,392,702 B2 | 8/2019 | Jung et al. | |
| 2001/0050052 A1 | 12/2001 | Moriyama | |
| 2010/0218724 A1 | 9/2010 | Okada | |
| 2018/0076017 A1 | 3/2018 | Hashimoto et al. | |
| 2018/0264516 A1 | 9/2018 | Fujikawa et al. | |
| 2019/0096738 A1* | 3/2019 | Okajima | C23C 16/4412 |
| 2020/0312655 A1 | 10/2020 | Nishida et al. | |
| 2020/0365388 A1 | 11/2020 | Asai et al. | |

FOREIGN PATENT DOCUMENTS

| | | |
|---|---|---|
| JP | 2010-226092 | 10/2010 |
| JP | 2019-062053 | 4/2019 |
| JP | 2020-167400 | 10/2020 |
| JP | 2020-188237 | 11/2020 |
| KR | 10-0631305 | 10/2006 |
| KR | 10-2010-0039084 | 4/2010 |
| KR | 10-1785330 | 10/2017 |
| KR | 10-2018-0106888 A | 10/2018 |
| KR | 10-1968414 | 4/2019 |
| KR | 10-2020-0012089 | 2/2020 |

OTHER PUBLICATIONS

Office Action issued in corresponding Application No. KR 10-2021-0030029 on Dec. 10, 2024.

\* cited by examiner

*Primary Examiner* — Michael P. Rodriguez
(74) *Attorney, Agent, or Firm* — F. CHAU & ASSOCIATES, LLC

(57) ABSTRACT

A substrate processing method includes: disposing a wafer in a wafer region of a tube; injecting an inert gas into a gap region, of the tube, between an inner side wall of the tube and the wafer disposed in the wafer region; and injecting a process gas into the wafer region of the tube, wherein a pressure of the gap region of the tube is higher than a pressure at an edge of the wafer region of the tube during the injection of the inert gas and the process gas.

20 Claims, 16 Drawing Sheets

SUBSTRATE PROCESSING APPARATUS INCLUDING FILLING GAS SUPPLY LINE AND SUBSTRATE PROCESSING METHOD USING THE SAME

CROSS-REFERENCE TO THE RELATED APPLICATION

This application. claims priority under 35 U.S.C. § 119 to Korean Patent Application No. 10-2021-0030029, filed on Mar. 8, 2021, in the Korean Intellectual Property Office, the disclosure of which is incorporated by reference herein in its entirety,

TECHNICAL FIELD

Exemplary embodiments of the present inventive concept relate to a substrate processing apparatus and a substrate processing method using the same. In particular, exemplary embodiments of the present inventive concept relate to a substrate processing apparatus including a filling gas supply line, and a substrate processing method using the same.

DISCUSSION OF THE RELATED ART

Generally, a substrate processing apparatus may perform. a substrate processing process which is one of a plurality of semiconductor device manufacturing processes. The substrate processing process may typically include a heat diffusion process or a deposition process for a semiconductor device. A general substrate processing apparatus may perform a substrate processing process for wafers vertically disposed on each other in a chamber, simultaneously.

SUMMARY

According to an exemplary embodiment of the present inventive concept, a substrate processing method includes: disposing a wafer in a wafer region of a tube; injecting an inert gas into a gap region, of the tube, between an inner side wall of the tube and the wafer disposed in the wafer region; and injecting a process gas into the wafer region of the tube, wherein a pressure of the gap region of the tube is higher than a pressure at an edge of the wafer region of the tube during the injection of the inert gas and the process gas.

According to an exemplary embodiment of the present inventive concept, a substrate processing method includes: disposing a wafer in a wafer region of a tube; injecting an inert gas into a gap region, of the tube, between an inner side wall of the tube and the wafer disposed in the wafer region; and injecting a process gas into the wafer region of the tube, wherein the injecting the inert gas into the gap region of the tube starts at a first time, wherein the injecting the process gas into the wafer region starts at a second time later than the first time, According to an exemplary embodiment of the present inventive concept, a substrate processing method includes: disposing a wafer in a wafer region of a tube; injecting an inert gas into a gap region, of the tube, between an inner side wall of the tube and the wafer; and injecting a process gas into the wafer region of the tube, wherein the gap region includes a first region and a second region, wherein the first region is between a filling gas supply line and an exhaust hole of the tube, and wherein the second region is between a process gas supply line and the filling gas supply line, wherein the injecting the inert gas into the gap region of the tube includes injecting the inert gas into the first region from the filling gas supply line.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein:

FIGS. 10A, 10E3 and 10C are graphs explaining variations in concentration of a process gas in a gap region according to variations in injection volume of an inert gas in a substrate processing method according to an exemplary embodiment of the present inventive concept.

DETAILED DESCRIPTION OF EXEMPLARY EMBODIMENTS

Figure 1A:
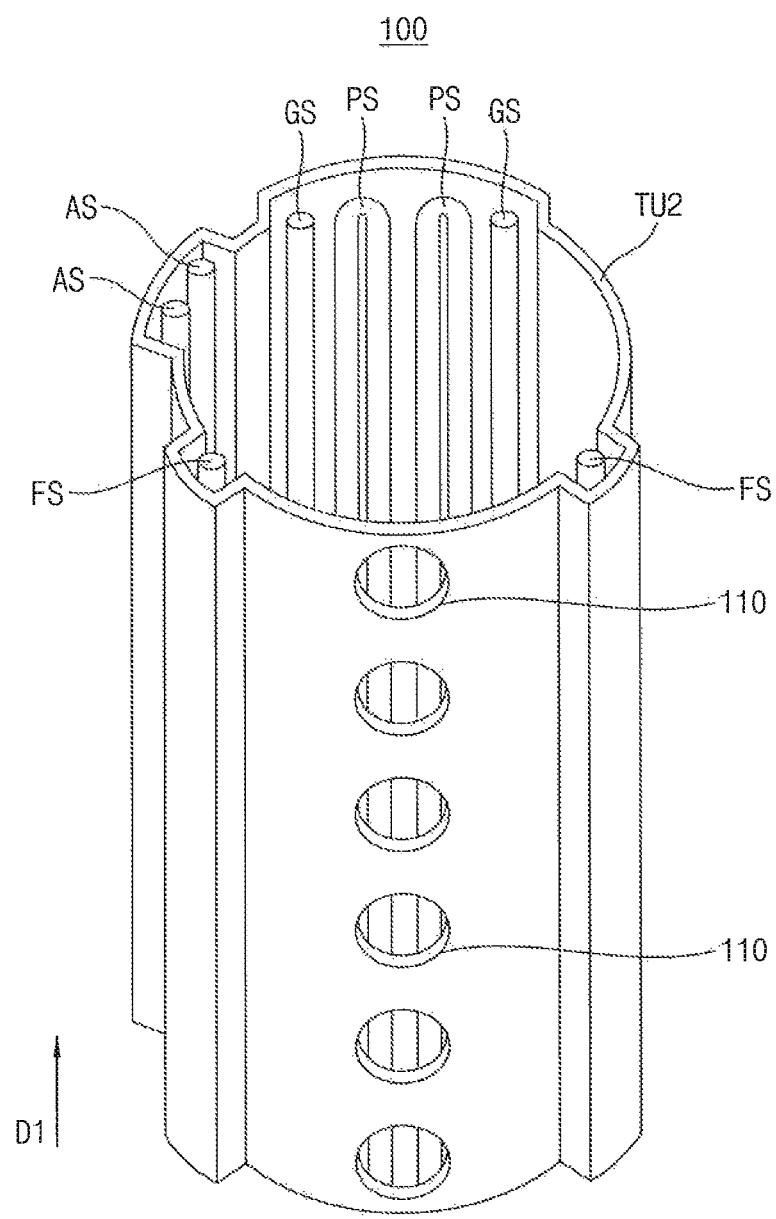
FIG. 1A is a perspective view of a substrate processing apparatus according to an exemplary embodiment of the present inventive concept.
Figure 1B:
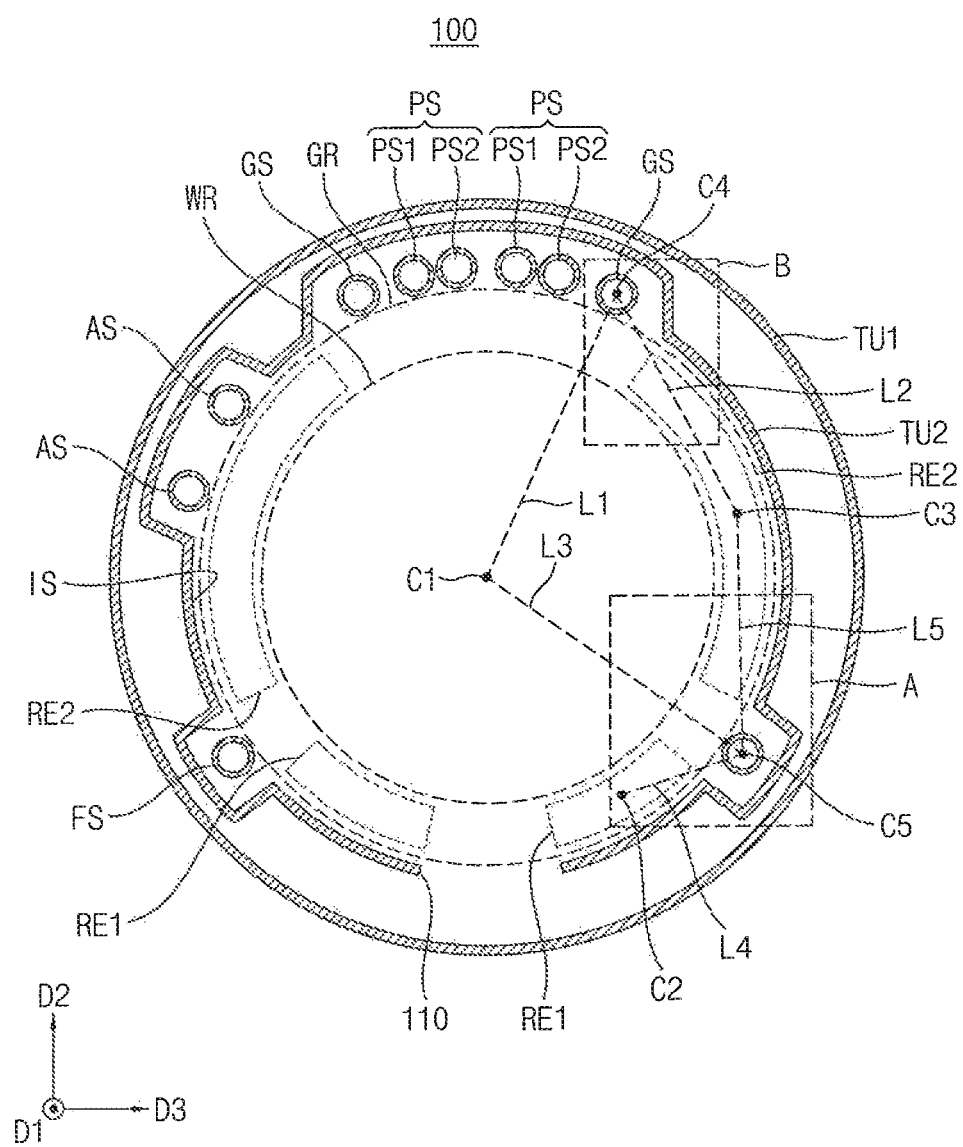
FIG. 1B is a plan view of the substrate processing apparatus of FIG. 1A.
Figure 1C:
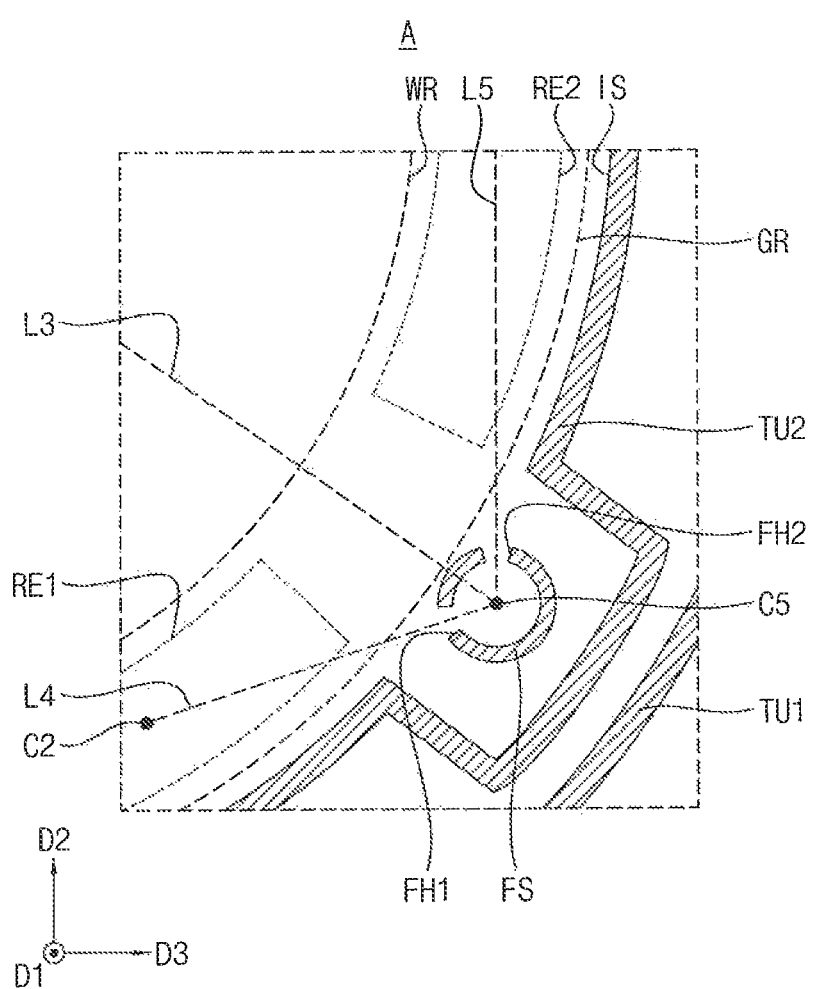
FIG. 1C is an enlarged view of a portion A of FIG. 1B.
Figure 1D:
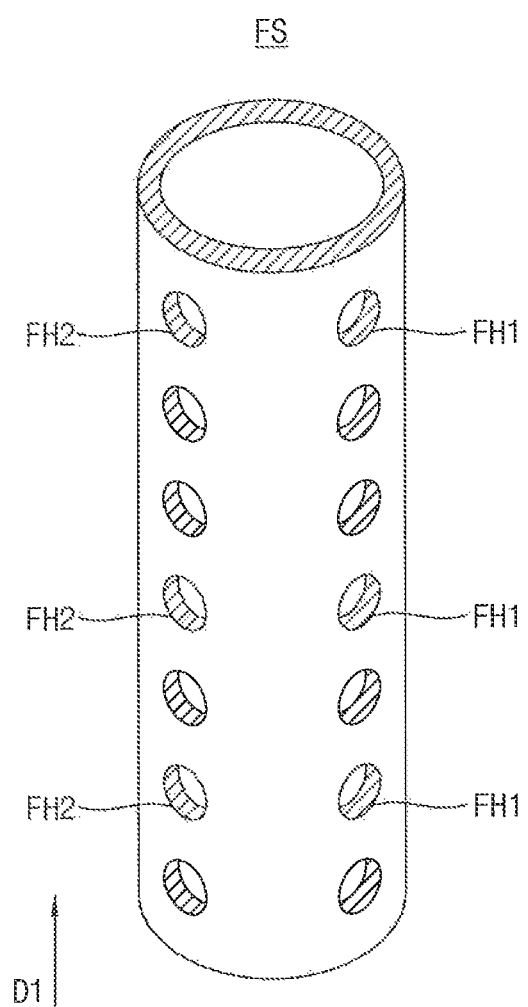
FIG. 1D is a perspective view of a filling gas supply line of FIG. 1A.
Figure 1E:
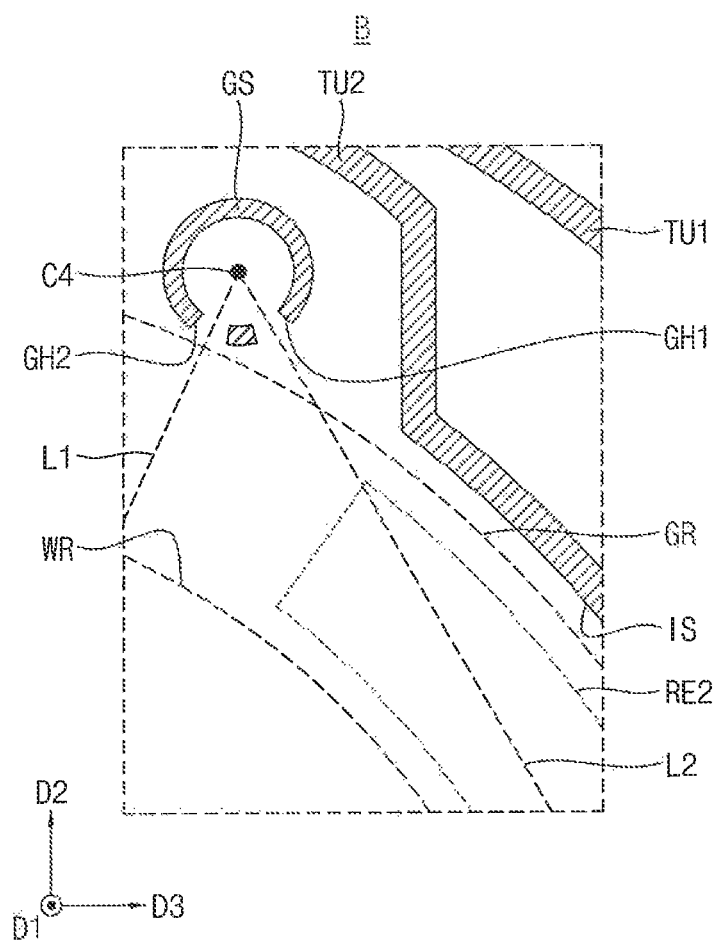
FIG. 1E is an enlarged view of a portion B of FIG. 1B.

FIG. 1A is a perspective view of a substrate processing apparatus according to an exemplary embodiment of the present inventive concept. FIG. 1B is a plan view of the substrate processing apparatus of FIG. 1A. FIG. 1C is an enlarged view of a portion A of FIG. 1B. FIG. 1D is a perspective view of a filling gas supply line of FIG. 1A. FIG. 1E is an enlarged view of a portion B of FIG. 1B.

Referring to FIGS. 1A and 1B, a substrate processing apparatus 100 may include a first tube TU1, a second tube TU2, process gas supply lines PS, guide gas supply lines GS, assistant gas supply lines AS, and filling gas supply lines FS.

The first tube TU1 may include an empty space therein. For example, the first tube TU1 may have a cylindrical shape extending in a first direction D1. However, the present inventive concept is not limited thereto. For example, the first tube TU1 may have a cuboid shape extending in the first direction Di. For example, the first direction D1 may be a vertical direction. A second direction D2 and a third direction D3 intersect th.e first direction D1. The second direction D2 and the third direction D3 may intersect each other. For example, the first direction D1 may perpendicularly intersect the second direction D2 and the third direction D3, and the second direction D2 may perpendicularly intersect the third direction D3. The first tube TU1 may be an outer tube of the substrate processing apparatus 100.

The second tube TU2 may be disposed in the empty space within the first tube TU1. The second tube TU2 may be surrounded by the first tube TU1. The second tube TU2 may include an empty space therein. For example, the second tube TU2 may have a cylindrical shape extending in the first direction D1. For example, the second tube TU2 may have a cuboid shape extending in the first direction D1. The second tube TU2 may be an inner tube within the first tube TU1 of the substrate processing apparatus 100.

The second tube TU2 may include an exhaust hole 110. For example, the second tube TU2 may include a plurality of exhaust holes 110 arranged in the first direction D1. The exhaust hole 110 may extend through a side wall of the second tube TU2. For example, the exhaust hole 110 may face an inner sidewall of the first tube TU1.

The process gas supply lines PS may be disposed in the second tube TU2. For example, the process gas supply lines PS may be at least partially surrounded by the second tube TU2. The process gas supply lines PS may extend in the first direction D1. For example, the process gas supply lines PS may have a bent shape. For example, the process gas supply lines PS may have an inverted U shape. Each of the process gas supply fines PS may include a first section PS1 and a second section PS2. The first section PS1 and the second section PS2 of the process gas supply line PS may extend in parallel to each other in the first direction D1. An upper portion of the first section PS1 and an upper portion of the second section PS2 in the process gas supply line PS may be connected to each other. The process gas supply line PS may include process holes arranged in the first direction D1. The process holes may extend through a side wall of the process gas supply line PS. The number and shape of the process gas supply lines PS are not limited to those shown and described above.

The guide gas supply lines GS may be disposed in the second tube TU2. For example, the guide gas supply lines GS may be at least partially surrounded by the second tube TU2. The guide gas supply line GS may be disposed adjacent to the process gas supply line PS. The guide gas supply lines GS may extend in the first direction D The process gas supply lines PS may be disposed among the guide gas supply lines GS. For example, two guide gas supply lines GS may be spaced apart from each other, and two process gas supply lines PS may be disposed between the two guide gas supply lines GS. The guide gas supply lines GS may be disposed at opposite sides of the process gas supply lines GS. The guide gas supply line GS may be provided between the filling gas supply line FS and the process gas supply line PS. The number and shape of the guide gas supply lines GS are not limited to those shown and described above.

The filling gas supply lines FS may be disposed in the second tube TU2. For example, the filling gas supply lines FS may be at least partially surrounded by the second tube TU2. The filling gas supply lines FS may extend in the first direction D1. For example, the filing gas supply lines FS may be disposed between the exhaust hole 110 and the guide gas supply lines GS. The exhaust hole 110 may be disposed between the filling gas supply lines FS, In other words, the filling gas supply lines FS may be disposed at opposite sides of the exhaust hole 110 of the second tube TU2. For example, the filling gas supply line FS may be disposed adjacent to the exhaust hole 110 of the second tube TU2. The filling gas supply line FS may be disposed nearer to the exhaust hole 110 than to the guide gas supply line GS. In other words, the minimum distance between the filling gas supply line FS and the guide gas supply line GS may be greater than the minimum distance between the filling gas supply line FS and the exhaust hole 110. However, the present inventive concept is not limited thereto. The filling gas supply line FS may be disposed nearer to the exhaust hole 110 than to the process gas supply lines PS. However, the present inventive concept is not limited thereto. The number and shape of the filling gas supply lines FS are not limited to those shown and described above.

The guide gas supply line GS may be disposed nearer to the process gas supply line PS than to the filling gas supply line FS. The process gas supply line PS may be disposed nearer to the guide gas supply line GS than to the filling gas supply line FS. The process gas supply lines PS and the guide gas supply lines GS may be disposed at a side opposite to the exhaust hole 110. For example, the process gas supply lines PS and the guide gas supply lines GS may face the exhaust hole 110. For example, a gap region GR (explained below) and a wafer region WR (explained below) are provided between the exhaust hole 110 and the process gas supply lines PS and the guide gas supply lines GS. In other words, the process gas supply lines PS and the guide gas supply lines GS may be disposed adjacent to a side wall, of the second tube TU2, opposite to the side wall, of the second tube TU2, formed with the exhaust hole 110.

The assistant gas supply lines AS may be disposed in the second tube TU2. For example, the assistant gas supply lines AS may be at least partially surrounded by the second tube TU2. The assistant gas supply lines AS may extend in the first direction D1. The assistant gas supply lines AS may be disposed between the guide gas supply line GS and the filling gas supply line FS. The assistant gas supply line AS may include assistant holes arranged in the first direction D1. The assistant holes may extend through a side wall of the assistant gas supply line AS. The number and shape of the assistant gas supply lines AS are not limited to those shown and described above.

The space in the second tube TU2 may include a wafer region WR and a gap region GR. The wafer region WR and the gap region GR may be provided in the second tube TU2. The wafer region WR may be provided at a central portion of the second tube TU2. The wafer region WR may be a region in which wafers are disposed in a substrate processing process.

The wafer region WR may extend in the first direction D1. The substrate processing apparatus 100 may further include a support member to support wafers. In a substrate processing process, wafers are supported by the support member and, as such, may be arranged in the first direction D1 to overlap each other. When viewed in a plan view according to FIG. 1B, the center of the wafer region WR may be a first center C1.

A region surrounding the wafer region WR may be defined as the gap region GR. For example, when viewed in a plan view according to FIG. 1B, the gap region GR may surround the wafer region WR. A region between the wafer region WR and an inner side wall IS of the second tube TU2 may be the gap region GR. The gap region GR may extend in the first direction D1. The gap region GR may be adjacent to an edge of the war region WR. The gap region GR may include a first region RE1 between the exhaust hole 110 and the filling gas supply line FS, and a second region RE2 between the filling gas supply line FS and the process gas supply line PS. The second region RE2 may be provided between the filling gas supply line FS and the guide gas supply GS. The first region RE1 may be a part of the gap region GR provided between the exhaust hole 110 and the filling gas supply line FS. The second region RE2 may be a part of the gap region GR provided between the filling gas supply line FS and the process gas supply line PS. The filling gas supply line FS may be provided between the first region RE1 and the second region RE2. The first region RE1 and the second region. RE2 may be provided at opposite sides of the filling gas supply line FS, respectively. First regions RE1 may be provided at opposite sides of the exhaust hole 110. Second regions RE2 may be provided at opposite sides of the wafer region WR. For example, from a plan view, the wafer region WR is between the second regions RE2. When viewed in a plan view according to FIG. 1B, the center of the first region RE1 may be a second center C2, and the center of the second region RE2 may be a third center C3. For example, the first region RE1 may be smaller than the second region RE2.

When viewed in a plan view according to FIG. 113, the center of the guide gas supply line GS may be a fourth center C4, and the center of the filling gas supply line FS may be a fifth center CS. A virtual first line L1 may connect the fourth center C4 and the first center C1 to each other. A virtual second line L2 may connect the fourth center C4 and the third center C3 to each other. A virtual third line L3 may connect the fifth center CS and the first center C1 to each other. A virtual fourth line L4 may connect the fifth center C5 and the second center C2 to each other. A virtual fifth line L5 may connect the fifth center C5 and the third center C3 to each other.

Referring to FIGS. 1C and 1D, the filling gas supply line FS may include first filling holes FH1 and second filling holes FH2. The first filling holes FH1 and the second filling holes FH2 may extend through a side wall of the filling gas supply line FS. A gas may be injected from the inside of the filling gas supply line FS to the outside of the filling gas supply line FS through the first and second filling holes FH1 and FH2. in an exemplary embodiment of the present inventive concept, the size of the first filling holes FH1 may differ from the size of the second filling holes FH2. However, the present inventive concept is not limited thereto. For example, the size of the first filling holes FH1 may be substantially the same as the size of the second filling holes FH2.

The first filling holes FH1 may be arranged in the first direction D1. The first filling holes FH1 may overlap one another in the first direction D1. The first filling hole FH1 may be open toward (or, e.g., may face) the exhaust hole 110. The first filling hole may be open toward the first region RE1 of the gap region GR. The first filling hole FH1 may be disposed nearer to the fourth line L4 than to the third line L3. For example, the fourth line L4 and the first filling hole FH1 may overlap each other in the first direction D1. For example, the fourth line L4 may extend through the first filing hole FH1.

The second filling holes FH2 may be arranged in the first direction D1. The second filling holes FH2 may overlap one another in the first direction D1. The second filling holes FH2 may be open toward the second region RE2 of the gap region GR. The second filling hole FH2 may be disposed nearer to the fifth line L5 than to the third line L3. For example, the fifth line L5 and the second filling hole FH2 may overlap each other in the first direction D1. For example, the fifth line L5 may extend through the second filling hole FH2. The third line L3 may be provided between the first filling hole FH1 and the second filling hole FH2.

The filling gas supply line other than the filling gas supply line FS shown in FIG. 1C; (for example, the left filling gas supply line FS in FIGS. 1A and 113) may also include first filling holes open toward the first region RE1 of the gap region GR, and second filling holes open toward the second region RE2 of the gap region GR.

Referring to FIG. 1E, the guide gas supply line GS may include first guide holes GH1 and second guide holes GH2. The first guide holes GH1 and the second guide holes GH2 may extend through a side wall of the guide gas supply line GS. A gas may be injected from the inside of the guide gas supply line GS to the outside of the guide gas supply line GS through the first and second guide holes GH1 and GH2.

The first guide holes GH1 may be arranged in the first direction D1. The first guide holes GH1 may overlap each other in the first direction D1. The first guide hole GH1 may be open toward the second region RE2 of the gap region GR. The first guide hole GH1 may be disposed nearer to the second line L2 than to the first line L1. For example, the second line L2 and the first guide hole GH1 may overlap each other in the first direction D1. For example, the second line L2 may extend through the first guide hole GH1.

The second guide holes GH2 may be arranged in the first direction D1. The second guide holes GH2 may overlap each other in the first direction D1. The second guide holes GH2 may open toward the wafer region WR. The second guide hole GH2 may be disposed nearer to the first line L1 than to the second line L2. For example, the first line L1 and the second guide hole GH2 may overlap each other in the first direction D1. For example, the first line L1 may extend through the second guide hole GH2.

The guide gas supply line other than the guide gas supply line GS shown in FIG. 1E (for example, the left guide gas supply line GS in FIG. 1A and 1B) may also include first guide holes open toward the second region RE2 of the gap region GR, and second guide holes open toward the wafer region WR.

The substrate processing apparatus according to an exemplary embodiment of the present inventive concept may include the filling gas supply line FS including the first and second filling holes and FH2, and the guide gas supply line GS including the first and second guide holes GH1 and GH2 and, as such, may inject an inert gas into the gap region GR between the wafer region WR, in which wafers are disposed, and the inner side wall IS of the second tube TU2. Accordingly, it may be possible to reduce a phenomenon in which a process gas injected from the process gas supply line PS into the wafer region WR flows into the gap region GR and, as such, the volume of the process gas provided to the wafer region WR may be increased.

Figure 2:
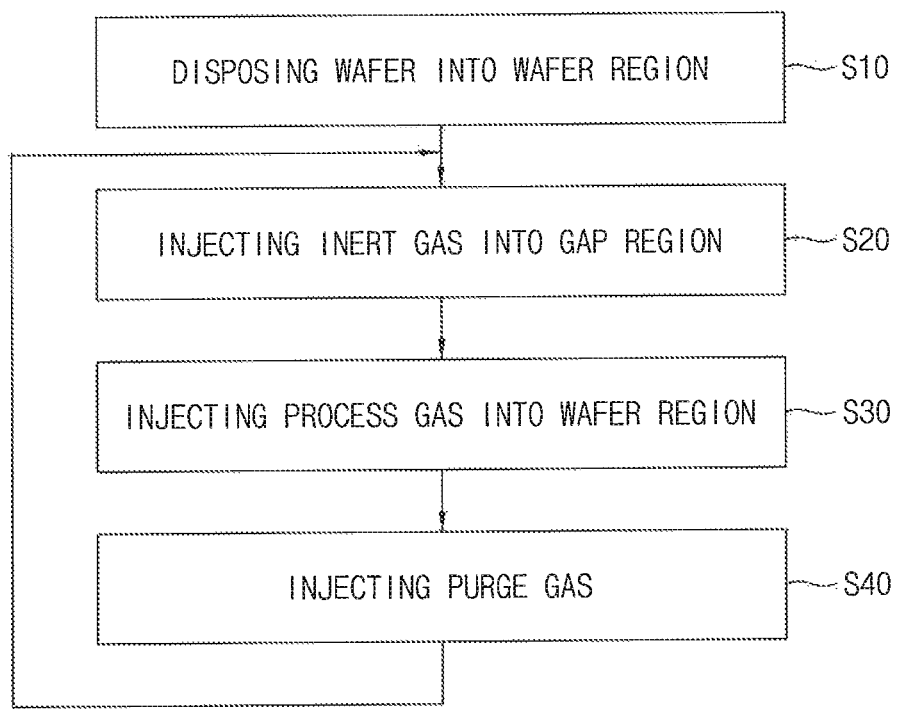
FIG. 2 is a flowchart showing a substrate processing method according to an exemplary embodiment of the present inventive concept.
Figure 3:
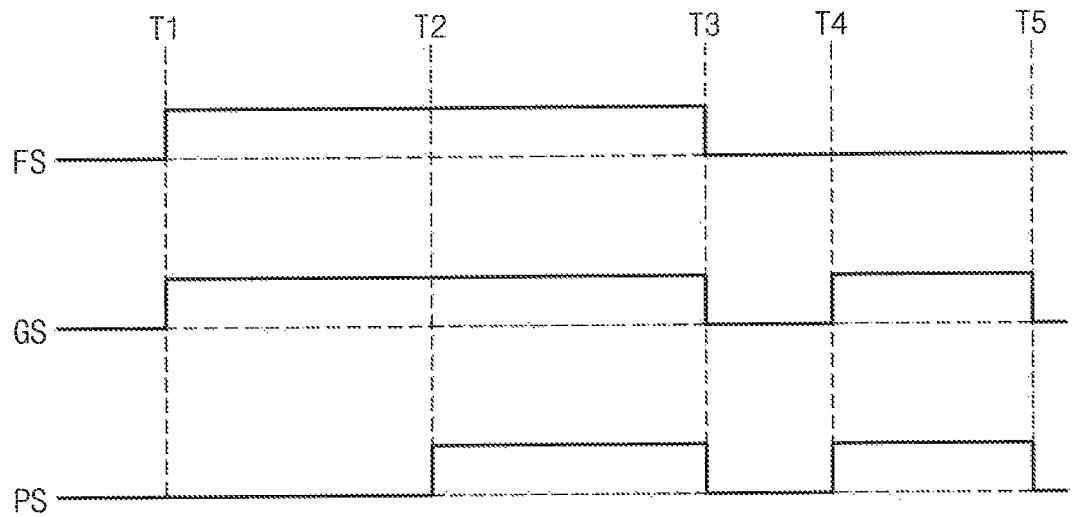
FIG. 3 is a diagram explaining operation of gas supply lines in the substrate processing method according to an exemplary embodiment of the present inventive concept.
Figure 4A:
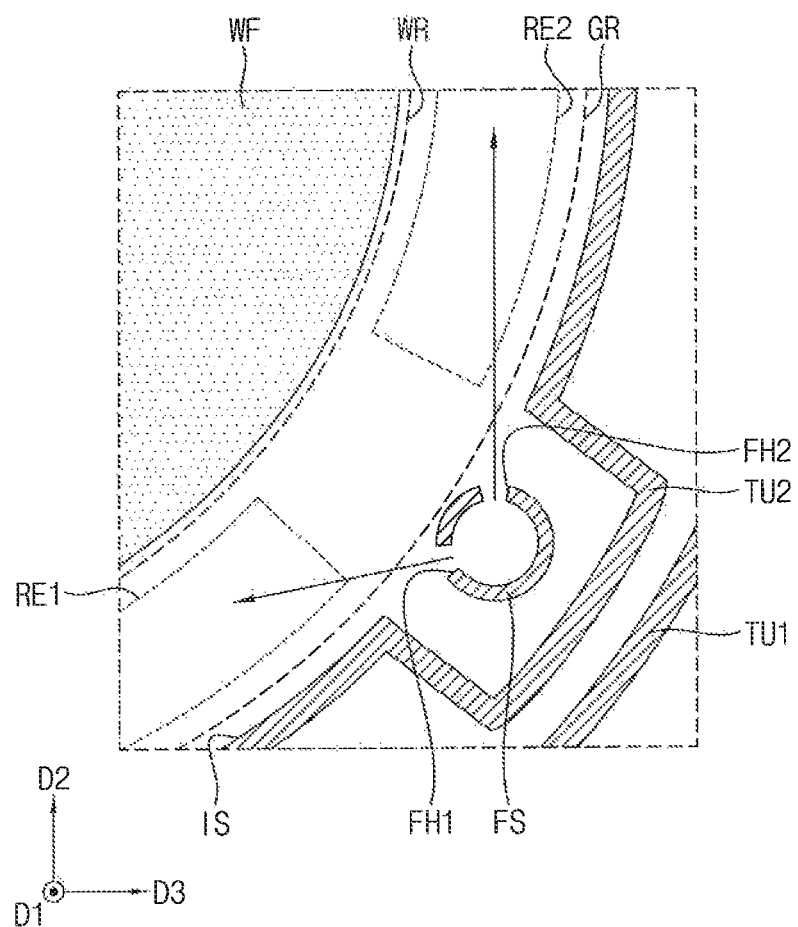
FIG. 4A is a view illustrating operation of a filling gas supply line in the substrate processing method according to an exemplary embodiment of the present inventive concept.
Figure 4B:
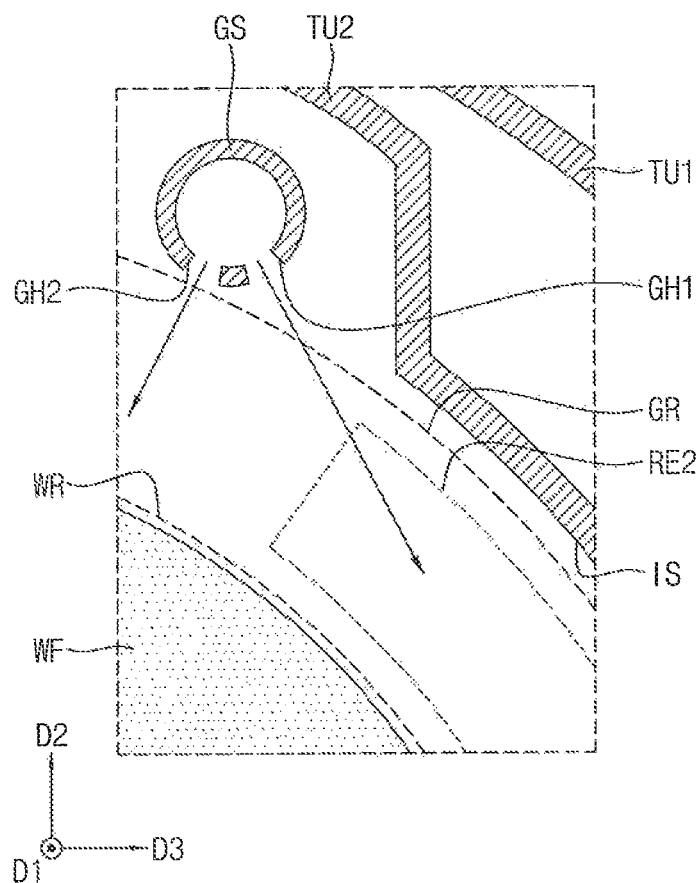
FIG. 4B is a view illustrating operation of a guide gas supply line in the substrate processing method according to an exemplary embodiment of the present inventive concept.

FIG. 2 is a flowchart showing a substrate processing method according to an exemplary embodiment of the present inventive concept. FIG. 3 is a diagram explaining operation of gas supply lines in the substrate processing method according to an exemplary embodiment of the present inventive concept. FIG. 4A is a view illustrating operation of a filling gas supply line in the substrate processing method according to an exemplary embodiment of the present inventive concept. FIG. 4B is a view illustrating operation of a guide gas supply line in the substrate processing method according to an exemplary embodiment of the present inventive concept.

Referring to FIGS. 2, 3, 4A and 4B, the substrate processing method according to the exemplary embodiments of the present inventive concept may include disposing a wafer in a wafer region (S10), injecting an inert gas into a gap region (S20), injecting a process gas into the wafer region (S30), and injecting a purge gas (S40).

A wafer WF may be disposed in a wafer region WR (S10). In an exemplary embodiment of the present inventive concept, a plurality of wafers WF may be disposed in the wafer region WR such that the plurality of wafers WF may overlap each other in a first direction D1.

After disposition of the wafer WF, an inert gas may be injected into a gap region GR between the wafer WF and an inner side wall IS of a second tube TU2 (S20). For example, the inert gas may be nitrogen gas; however, the present inventive concept is not limited thereto. Injection of the inert gas into the gap region GR may include injecting an inert gas from a filling gas supply line FS, and injecting an inert gas from the guide gas supply line GS. Inert gas injection at the filling gas supply line FS and the guide gas supply line OS may start at a first time T1, may continue to pass at a second time T2 later than the first time T1, and may end at a third time T3 later than the second time T2. Inert gas injection at the filling gas supply line FS and the guide gas supply line GS may simultaneously start and simultaneously end.

Inert gas injection at the filling gas supply line FS may include injecting an inert gas into a first region RE1 of the gap region GR through a first filling hole of the filling gas supply line FS, and injecting an inert gas into a second region RE2 of the gap region GR through a second filling hole FH2 of the filling gas supply line FS. The inert gas injected from the filling gas supply line FS into the gap region GR may increase the pressure of the gap region GR.

Inert gas injection at the guide gas supply line GS may include injecting an inert gas into the second region RE2 of the gap region GR through a first guide hole GH1 of the guide gas supply line OS, The inert gas injected from the guide gas supply line GS into the gap region GR may increase the pressure of the gap region GR An inert gas may be injected into the wafer region WR through a second guide hole GH2 of the guide gas supply line GS. The inert gas injected through the second guide hole GH2 of the guide gas supply line GS may cause a process gas, which is injected in a subsequent process, to be concentrated in the wafer region WR.

A process gas may be injected into the wafer region WR (S30). For example, the process gas may be a precursor gas or a reactive gas reacting with a precursor gas. Injection of the process gas into the wafer region WR may include injecting a process gas from a process gas supply line PS. Inert gas injection at the process gas supply line PS may start at the second time T2, and may end at the third time T3. Inert gas injection at the process gas supply line PS may end simultaneously with the termination of the inert gas injection at the filling gas supply line FS and the guide gas supply line GS. An inert gas may be injected from an assistant gas supply line AS from the second time T2 to the third time T3 to achieve an enhancement in distribution of the process gas.

An inert gas may be injected from the filling gas supply line FS and the guide gas supply line GS from the first time T1 to the second time T2 such that the pressure of the gap region GR becomes higher than the pressure of the wafer region WR. For example, the inert gas may be injected such that the pressure of the gap region GR becomes higher than the pressure of the wafer region WR at substantially the same level. The filling gas supply line FS and the guide gas supply line GS may inject the inert gas such that an average pressure of the gap region GR becomes higher than an average pressure of the wafer region WR.

From the second time T2 to the third time T3, the filling gas supply line FS and the guide gas supply line GS may inject the inert gas and the process gas supply line PS may inject the process gas such that the pressure of the gap region GR becomes higher than the pressure of an edge of the wafer region WR while becoming lower than the pressure of a center of the wafer region WR. For example, the inert gas and the process gas may be injected such that the pressure of the gap region GR becomes higher than the pressure of the edge of the wafer region WR at the same level and becomes lower than the pressure of the center of the wafer region WR at the same level. During injection of the inert gas and the process gas from the filling gas supply line FS, the guide gas supply line GS and the process gas supply line PS, the maximum pressure of the gap region UR may be higher than the minimum pressure of the wafer region WR and lower than the maximum pressure of the wafer region WR.

A purge gas may be injected after ending of injection of the inert gas and the process gas (S40). The purge gas may be injected from the guide gas supply line GS and the process gas supply line PS from a fourth time T4, later than the third time T3, to a fifth time T5 later than the fourth time T4. A residual gas may be removed through injection of the purge gas.

After ending of injection of the purge gas, inert gas injection (S20) may start again in accordance with repetition of a substrate processing process cycle.

Since the substrate processing method according to an exemplary embodiment of the present inventive concept includes injection of the inert gas into the gap region GR (S20), a phenomenon in which the process gas injected into the wafer region WR flows into the gap region GR may be reduced, and the volume of the process gas provided to the wafer region WR may be increased.

When the pressure of the gap region GR is increased in accordance with injection of the inert gas into the gap region GR in the substrate processing method according to an exemplary embodiment of the present inventive concept, the concentration of the process gas at the edge of the wafer region WR may be lowered. Accordingly, it may be possible to adjust the concentration distribution of the process gas at the center and edge of the wafer region by adjusting the injection volume of the inert gas.

Figure 5:
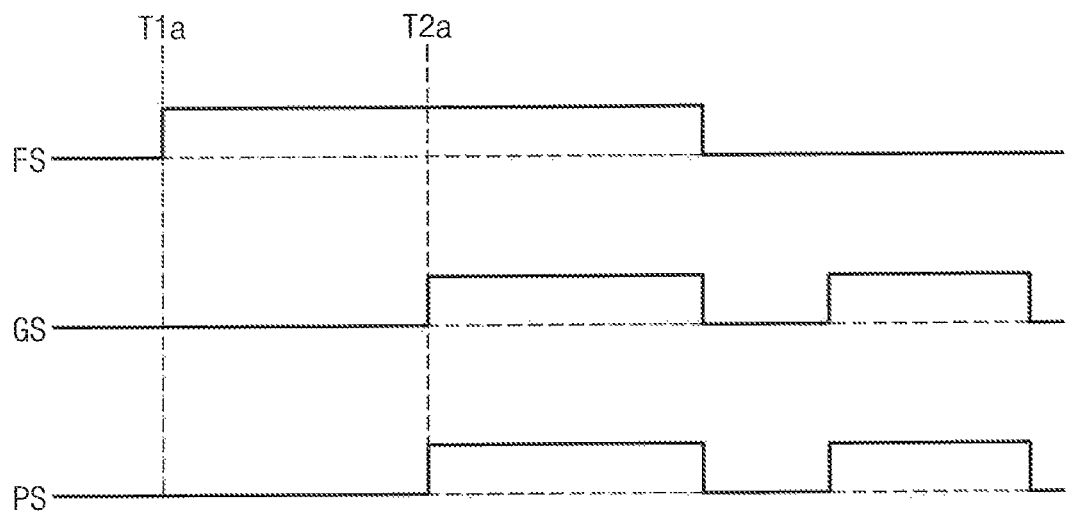
FIG. 5 is a diagram explaining operation of gas supply lines in a substrate processing method according to an exemplary embodiment of the present inventive concept.

FIG. 5 is a diagram explaining operation of gas supply lines in a substrate processing method according to an exemplary embodiment of the present inventive concept, Referring to FIG. 5, in an exemplary embodiment of the present inventive concept, an inert gas may be injected only from a filling gas supply line FS from a first time T1a to a second time T2a. In other words, no inert gas may be injected from a guide gas supply line OS from the first time T1*a* to the second time T2*a*. The guide gas supply line OS may inject an inert gas beginning at the second time T2*a*.

Figure 6:
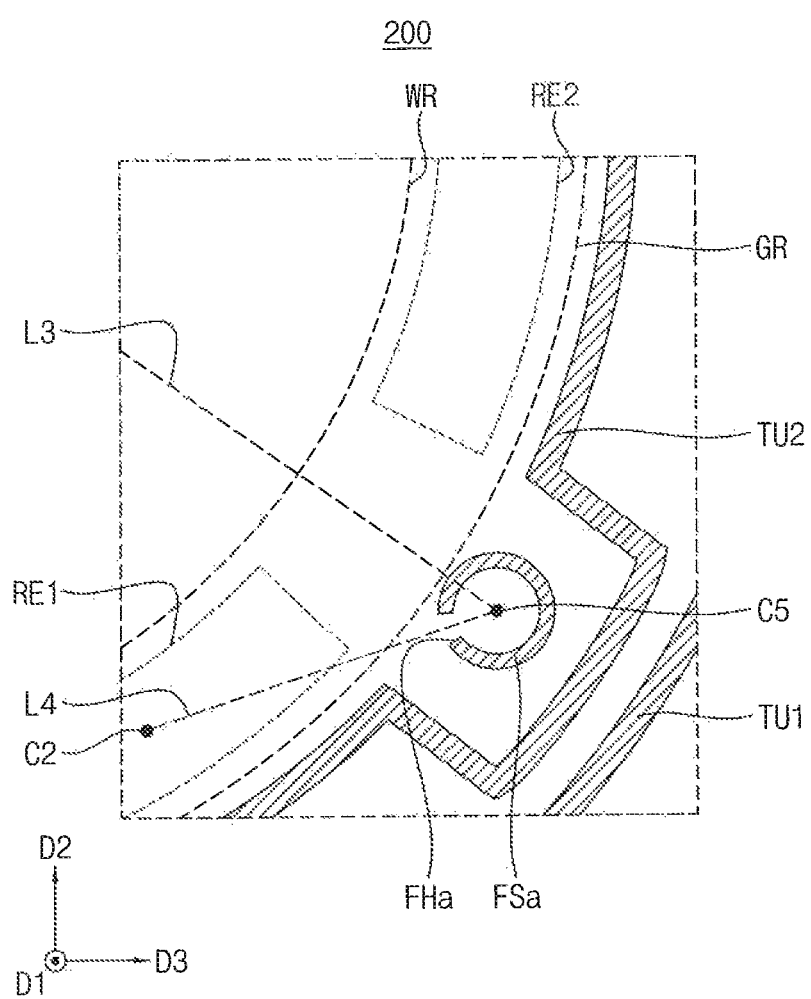
FIG. 6 is a view illustrating a filling gas supply line of a substrate processing apparatus according to an exemplar r embodiment of the present inventive concept.

FIG. 6 is a view illustrating a. filling gas supply line of a substrate processing apparatus according to an exemplary embodiment of the present inventive concept.

Referring to FIG. 6, a filling gas supply line FSa of a substrate processing apparatus 200 may include filling holes open toward a first region RE1 of a gap region GR.

For example, all filling holes FHa of the filling gas supply line FSa may be open toward the first region RE1 of the gap region GR. For example, the filling gas supply line FSa of the substrate processing apparatus 200 may not include filling holes open toward a second region RE2 of the gap region GR, which is different from the substrate processing apparatus 100 of FIGS. 1A to 1E according to an exemplary embodiment of the present inventive concept.

Figure 7:
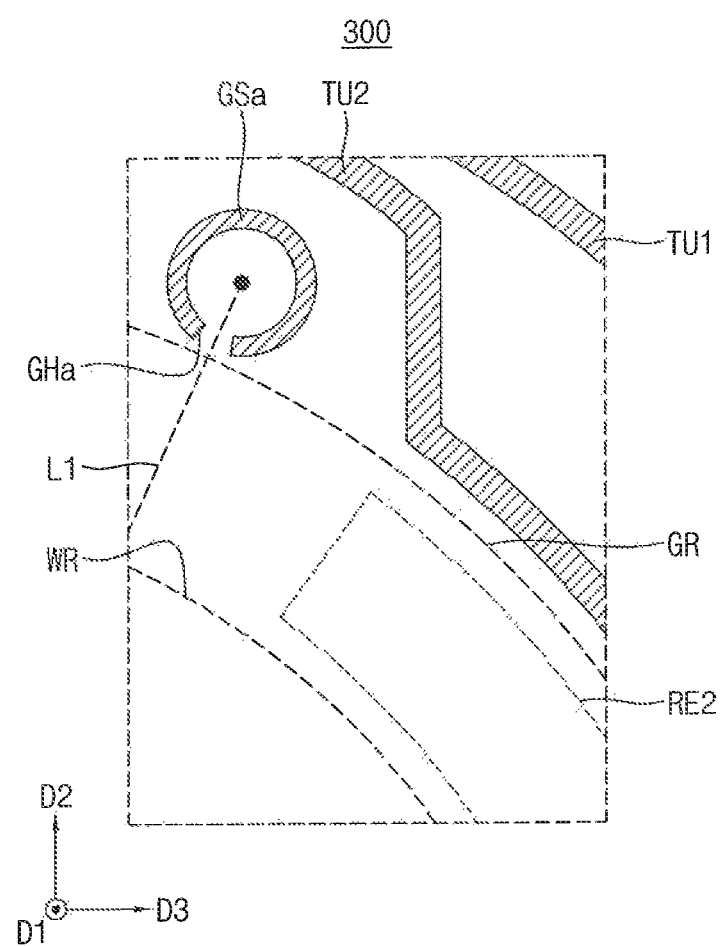
FIG. 7 is a view illustrating a guide gas supply line of a substrate processing apparatus according to an exemplary embodiment of the present inventive concept.

FIG. 7 is a view illustrating a guide gas supply line of a substrate processing apparatus according to an exemplary embodiment of the present inventive concept.

Referring to FIG. 7, a guide gas supply line GSa of a substrate processing apparatus 300 may include guide holes GHa open toward a wafer region WR. For example, all guide holes GHa of the guide gas supply line GSa may be open toward the wafer region WR. For example, the guide gas supply line GSa of the substrate processing apparatus 300 may not include guide holes open toward a second region RE2 of a gap region GR, which is different from the substrate processing apparatus 100 of FIGS. 1A to 1E according to an exemplary embodiment of the present inventive concept.

Figure 8:
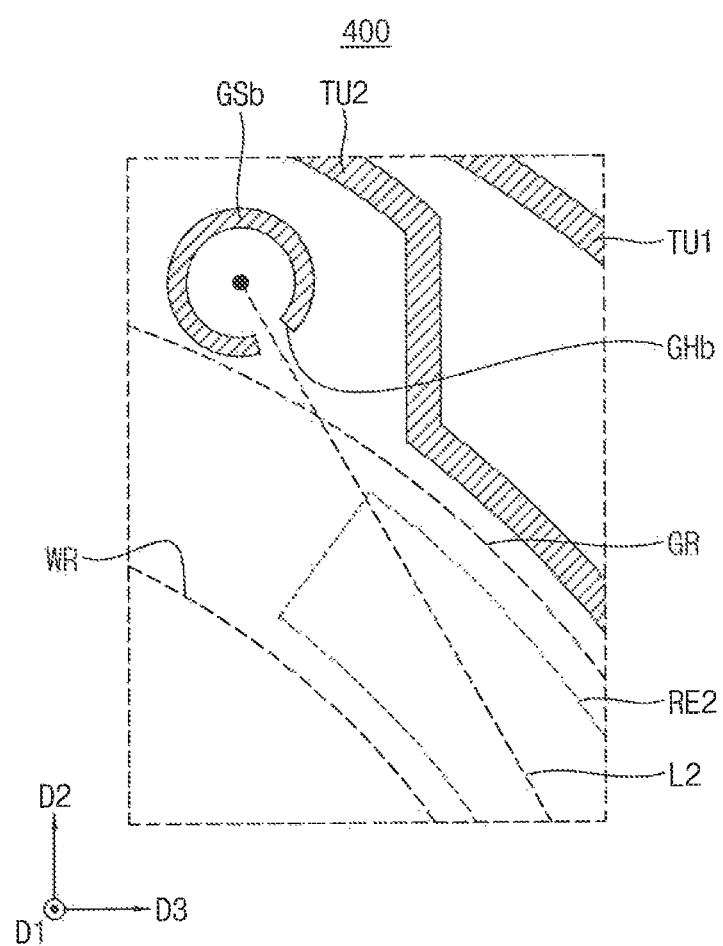
FIG. 8 is a view illustrating a guide gas supply line of a substrate processing apparatus according to an exemplary embodiment of the present inventive concept.

FIG. 8 is a view illustrating a guide gas supply line of a substrate processing apparatus according to an exemplary embodiment of the present inventive concept.

Referring to FIG. 8, a guide gas supply line GSb of a substrate processing apparatus 400 may include guide holes GHb open toward a second region RE2 of a gap region GR. For example, all guide holes GHb of the guide gas supply line GSb may be open toward the second region RE2 of the gap region GR. For example, the guide gas supply line GSb of the substrate processing apparatus 400 may not include guide holes open toward a wafer region WR, which is different from the substrate processing apparatus 100 of FIGS. 1A to 1E according to an exemplary embodiment of the present inventive concept.

Figure 9:
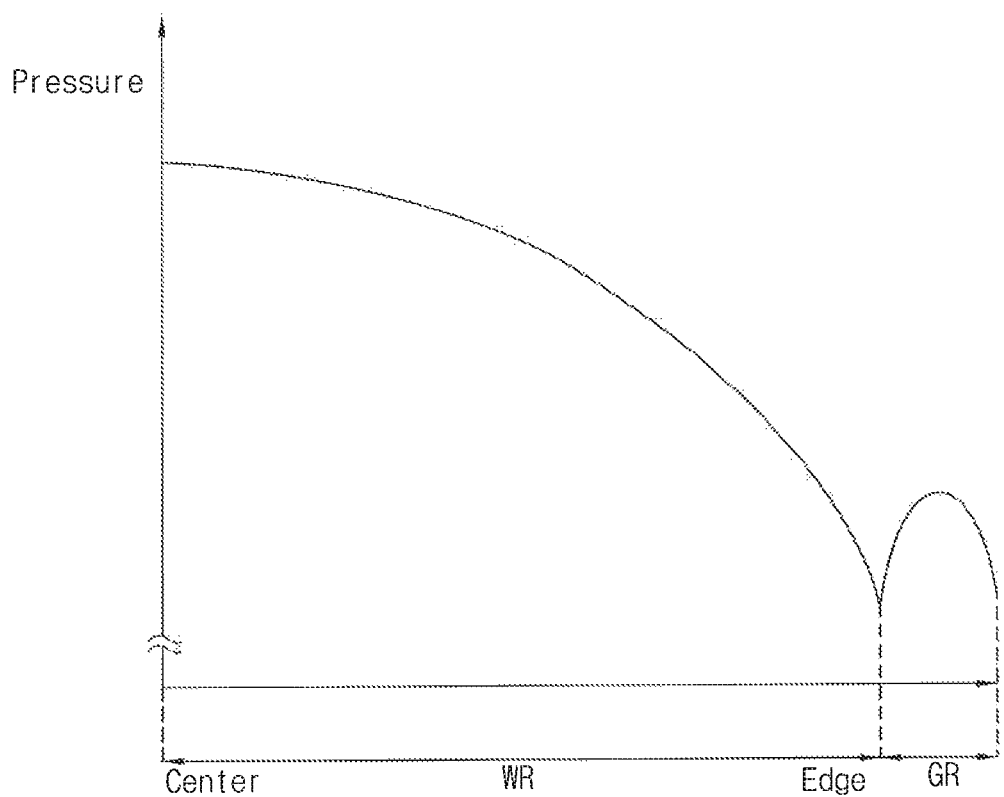
FIG. 9 is a graph explaining the pressures of a wafer region and a gap region in a substrate processing method according to an exemplary embodiment of the present inventive concept.

FIG. 9 is a graph explaining the pressures of a wafer region and a gap region in a substrate processing method according to an exemplary embodiment of the present inventive concept.

Referring to FIG. 9, the pressure of a gap region GR may be higher than the pressure of an edge of a wafer region WR and lower than the pressure of a center of the wafer region WR when gas supply lines inject an inert gas and a process gas into the gap region GR and the wafer region WR (for example, from the second time T2 to the third time T3 in FIG. 3). The maximum pressure of the gap region GR may be higher than the minimum pressure of the wafer region WR and lower than the maximum pressure of the wafer region WR. Although the pressure is shown as being minimized at a boundary between the wafer region WR and the gap region GR, exemplary embodiments of the present inventive concept are not limited thereto.

Figure 10A:
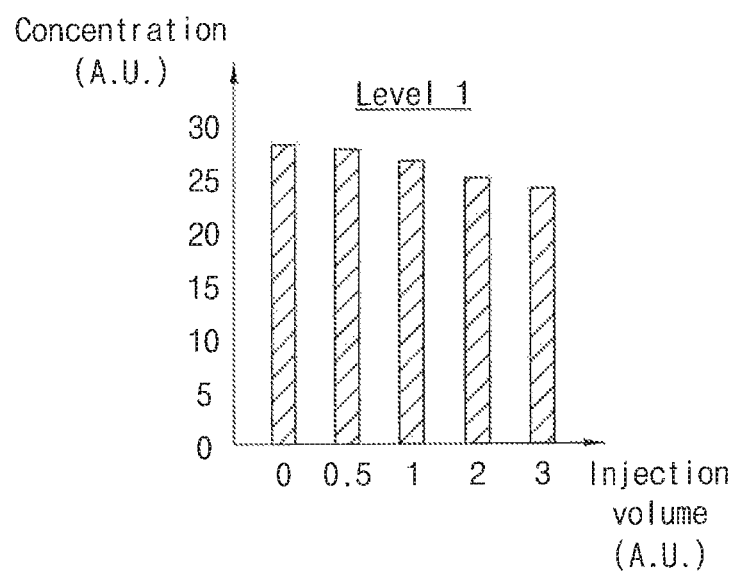
Figure 10B:
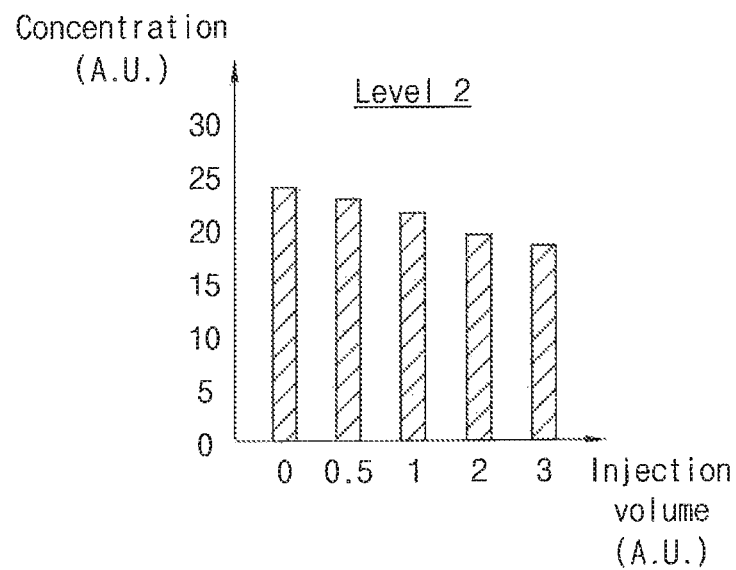
Figure 10C:
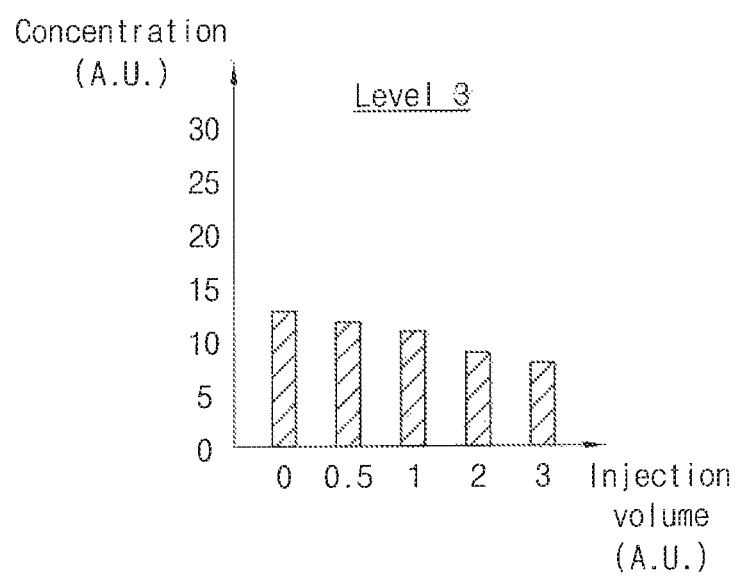

FIGS. 10A, 10B and 10C are graphs explaining variation in concentration of a process gas in a gap region according to variation in injection volume of an inert gas in a substrate processing method according to an exemplary embodiment of the present inventive concept.

FIG. 10A is a graph depicting concentration variation of the process gas at a first level of a gap region GR according to injection volume variation of the inert gas. FIG. 10B is a graph depicting concentration variation of the process gas at a second level of the gap region GR according to injection volume variation of the inert gas. FIG. 10C is a graph depicting concentration variation of the process gas at a third level of the gap region GR according to injection volume variation of the inert gas. Here, under the condition that the injection volume of the inert gas is substantially constant, the concentration of the process gas may be higher at the second level of the gap region GR than at the third level of the gap region GR, and may be higher at the first level of the gap region GR than at the second level of the gap region GR. In an exemplary embodiment of the present inventive concept, the first level may be an upper level of the gap region GR. The second level may be a middle level of the gap region GR, and the third level may be a lower level of the gap region GR. For example, the second level of the gap region GR may be higher than the third level of the gap region GR, and the first level of the gap region GR may be higher than the second level of the gap region GR.

Referring to FIGS. 10A, 10B and 10C, at all of the first to third levels of the gap region GR, the concentration of the process gas may be reduced as the injection volume of the inert gas increases.

Figure 11A:
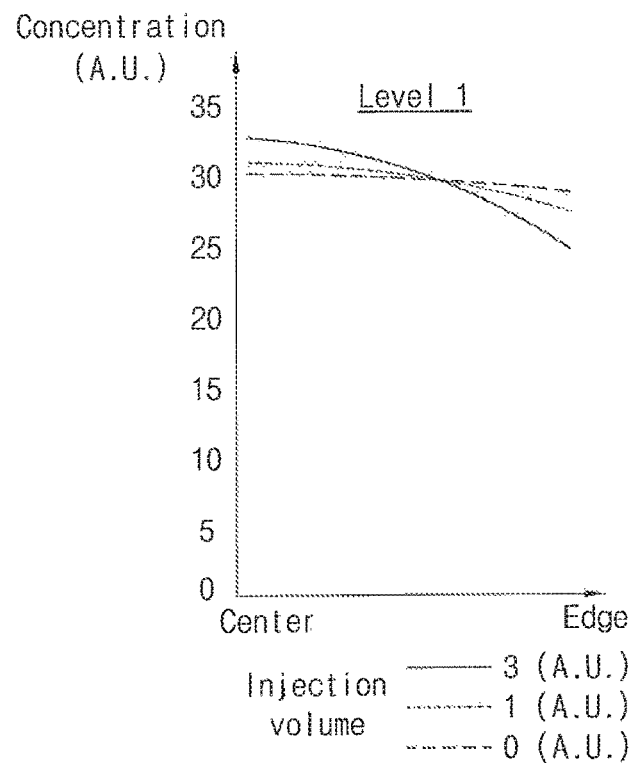
FIGS. 11A, 11B and 11C are graphs explaining variations in concentration of a process gas in a wafer region according to variations in injection volume of an inert gas in a substrate processing method according to an exemplary embodiment of the present inventive concept.
Figure 11B:
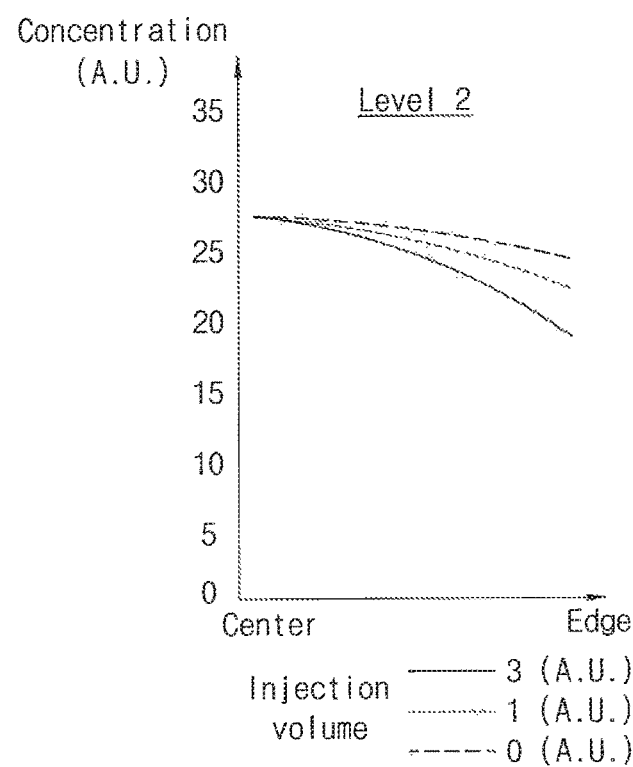
Figure 11C:
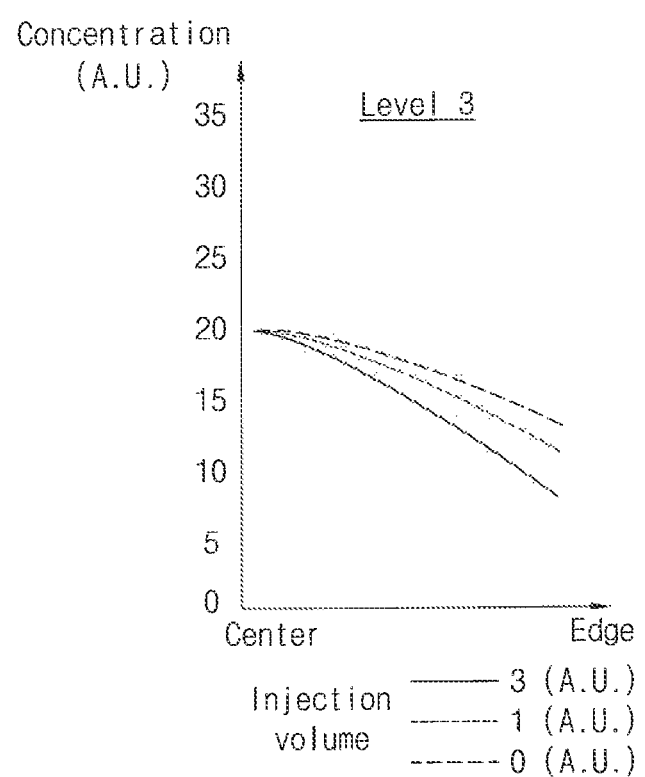

FIGS. 11A, 11B and 11C are graphs explaining variation in concentration of a process gas in a wafer region according to variation in injection volume of an inert gas in a substrate processing method according to an exemplary embodiment of the present inventive concept.

FIG. 11A is a graph depicting concentration variation of the process gas at a first level of a wafer region WR according to injection volume variation of the inert gas. FIG. 11B is a graph depicting concentration variation of the process gas at a second level of the wafer region WR. according to injection volume variation of the inert gas. FIG. 11C is a graph depicting concentration variation of the process gas at a third level of the wafer region WR according to injection volume variation of the inert gas. Here, under the condition that the injection volume of the inert gas is substantially constant, the concentration of the process gas may be higher at the second level of the wafer region WR than at the third level of the wafer region WR, and the concentration of the process gas may be higher at the first level of the wafer region WR than at the second level of the wafer region WR. In an exemplary embodiment of the present inventive concept, the first level may be an upper level of the wafer region WR, the second level may be a middle level of the wafer region WR, and the third level may be a lower level of the wafer region WR. For example, the second level of the wafer region WR may be higher than the third level of the wafer region WR, and the first level of the wafer region WR may be higher than the second level of the wafer region WR.

Referring to FIGS. 11A, 11B and 11C, at all of the first to third levels of the wafer region WR, the concentration of the process gas at an edge of the wafer region WR may be reduced as the injection volume of the inert gas increases.

A substrate processing apparatus according to an exemplary embodiment of the present inventive concept may include a gas supply line to inject an inert gas into a gap region between a wafer and a tube and, as such, the substrate processing apparatus may reduce the phenomenon in which a process gas flows into the gap region between the wafer and the tube.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A substrate processing method comprising:
disposing a wafer in a wafer region of a tube that is inside an outer tube;
injecting an inert gas into a gap region, of the tube, between an inner side wall of the tube and the wafer disposed in the wafer region, wherein the inert gas is injected into the gap region from a first filling hole of a filling gas supply line, and wherein the first filling hole faces in a direction between the inner sidewall of the tube and a circumference of the wafer region; and
injecting a process gas into the wafer region of the tube, wherein a pressure of the gap region of the tube is higher than a pressure at an edge of the wafer region of the tube during the injection of the inert gas and the process gas.

2. The substrate processing method of claim 1, wherein the edge of the wafer region is adjacent to the gap region.

3. The substrate processing method of claim 1, wherein:
the injecting the inert gas into the gap region is performed at a first time, and
the injecting the process gas into the wafer region is performed at a second time later than the first time.

4. The substrate processing method of claim 1,
wherein the gap region comprises a first region and a second region, wherein the first region is between an exhaust hole of the tube and thea filling gas supply line, wherein the second region is between the filling gas supply line and a process gas supply line, and
wherein the injecting the inert gas into the gap region comprises injecting the inert gas into the first region and the second region from the filling gas supply line.

5. The substrate processing method of claim 4, wherein the injecting the inert gas into the gap region further comprises injecting the inert gas into the second region from a guide gas supply line disposed between the filling gas supply line and the process gas supply line.

6. The substrate processing method of claim 5, wherein the injecting the inert gas from the guide gas supply line comprises injecting the inert gas through a first guide hole of the guide gas supply line, and wherein the first guide hole faces the second region.

7. The substrate processing method of claim 5, further comprising:
injecting the inert gas into the wafer region from the guide gas supply line through a second guide hole of the guide gas supply line, and wherein the second guide hole faces the wafer region.

8. The substrate processing method of claim 4, wherein the injecting the inert gas into the first region from the filling gas supply line comprises injecting the inert gas through the first filling hole of the filling gas supply line, and wherein the first filling hole faces the first region.

9. The substrate processing method of claim 4, wherein the injecting the inert gas into the second region from the filling gas supply line comprises injecting the inert gas through a second filling hole of the filling gas supply line, and wherein the second filling hole faces the second region.

10. A substrate processing method comprising:
disposing a wafer in a wafer region of a tube that is inside an outer tube;
injecting an inert gas into a gap region, of the tube, between an inner side wall of the tube and the wafer disposed in the wafer region, wherein the inert gas is injected into the gap region from a first filling hole of a filling gas supply line, and wherein the first filling hole faces in a direction between the inner sidewall of the tube and a circumference of the wafer region; and
injecting a process gas into the wafer region of the tube, wherein the injecting the inert gas into the gap region of the tube starts at a first time,
wherein the injecting the process gas into the wafer region starts at a second time later than the first time.

11. The substrate processing method of claim 10, wherein the filling gas supply line is disposed nearer to an exhaust hole of the tube than to a process gas supply line.

12. The substrate processing method of claim 11, wherein the gap region comprises a first region between the exhaust hole and the filling gas supply line, and
the injecting the inert gas into the gap region comprises injecting the inert gas into the first region from the filling gas supply line.

13. The substrate processing method of claim 10, wherein the injecting the inert gas into the gap region and the injecting the process gas into the wafer region simultaneously end at a third time later than the second time.

14. The substrate processing method of claim 10, wherein the gap region comprises a first region and a second region, wherein the filling gas supply line is disposed between the first region and the second region,
wherein the filling gas supply line further comprises a second filling hole, wherein the first filling hole faces the first region, and wherein the second filling hole faces the second region.

15. A substrate processing method comprising:
disposing a wafer in a wafer region of a tube that is inside an outer tube;
injecting an inert gas into a gap region, of the tube, between an inner side wall of the tube and the wafer; and
injecting a process gas into the wafer region of the tube, wherein the gap region comprises a first region and a second region, wherein the first region is between a filling gas supply line and an exhaust hole of the tube, and wherein the second region is between a process gas supply line and the filling gas supply line,
wherein the injecting the inert gas into the gap region of the tube comprises injecting the inert gas into the first region from the filling gas supply line,
wherein the injecting the inert gas into the first region from the filling gas supply line comprises injecting the inert gas through a first filling hole of the filling gas supply line, and wherein the first filling hole faces in a direction between the inner sidewall of the tube and a circumference of the wafer region.

16. The substrate processing method of claim 15, wherein the first filling hole faces the first region.

17. The substrate processing method of claim 15, wherein the injecting the inert gas into the gap region further comprises injecting the inert gas into the second region from the filling gas supply line.

18. The substrate process method of claim 17, wherein the injecting the inert gas into the second region from the filling gas supply line comprises injecting the inert gas through a second filling hole of the filling gas supply line, and wherein the second filling hole faces the second region.

19. The substrate processing method of claim 15, wherein the injecting the inert gas into the gap region comprises injecting the inert gas into the second region from a guide gas supply line disposed between the process gas supply line and the filling gas supply line.

20. The substrate processing method of claim 19, wherein the injecting the inert gas into the second region from the guide gas supply line comprises injecting the inert gas through a first guide hole of the guide gas supply line, and wherein the first guide hole faces the second region.

\* \* \* \* \*